United States Patent
Fan et al.

(10) Patent No.: US 6,734,044 B1
(45) Date of Patent: May 11, 2004

(54) MULTIPLE LEADFRAME LAMINATED IC PACKAGE

(75) Inventors: Chun Ho Fan, Sham Tseng (HK); Tsui Yee Lin, Kowloon (HK); Kin Pui Kwan, N.T. (HK); Shui Ming Tse, Sai Wan Ho (HK); Wing Him Lau, Yuen Long N.T. (HK); Shuk Man Wong, Tai Kok KLN. (HK)

(73) Assignee: ASAT Ltd., New Territories (HK)

( * ) Notice: Subject to any disclaimer, the term of this patent is extended or adjusted under 35 U.S.C. 154(b) by 54 days.

(21) Appl. No.: 10/166,458

(22) Filed: Jun. 10, 2002

(51) Int. Cl.[7] ................................................. H01L 21/44
(52) U.S. Cl. ...................... 438/123; 438/106; 257/666; 257/668
(58) Field of Search ................................ 438/106, 118, 438/123; 257/666, 668, 685

(56) References Cited

U.S. PATENT DOCUMENTS

| | | | |
|---|---|---|---|
| 6,081,031 A | | 6/2000 | Letterman, Jr. et al. |
| 6,555,899 B1 | * | 4/2003 | Chung et al. ............... 257/670 |
| 6,677,672 B2 | * | 1/2004 | Knapp et al. ............... 257/687 |

* cited by examiner

*Primary Examiner*—Michael S. Lebentritt
*Assistant Examiner*—Brad Smith
(74) *Attorney, Agent, or Firm*—Keating & Bennett, LLP

(57) ABSTRACT

A method of fabricating an integrated circuit package. The method includes providing a first leadframe and a second leadframe, laminating the second leadframe to a portion of the first leadframe in order to create a multi-layer laminated leadframe, and mounting a semiconductor die on another portion of the first leadframe.

9 Claims, 9 Drawing Sheets

PRIOR ART

Step 1

Step 2

Step 3

Step 4

Step 5

Step 6

Step 1

Step 2

Step 3

Step 4

Step 5

Step 6

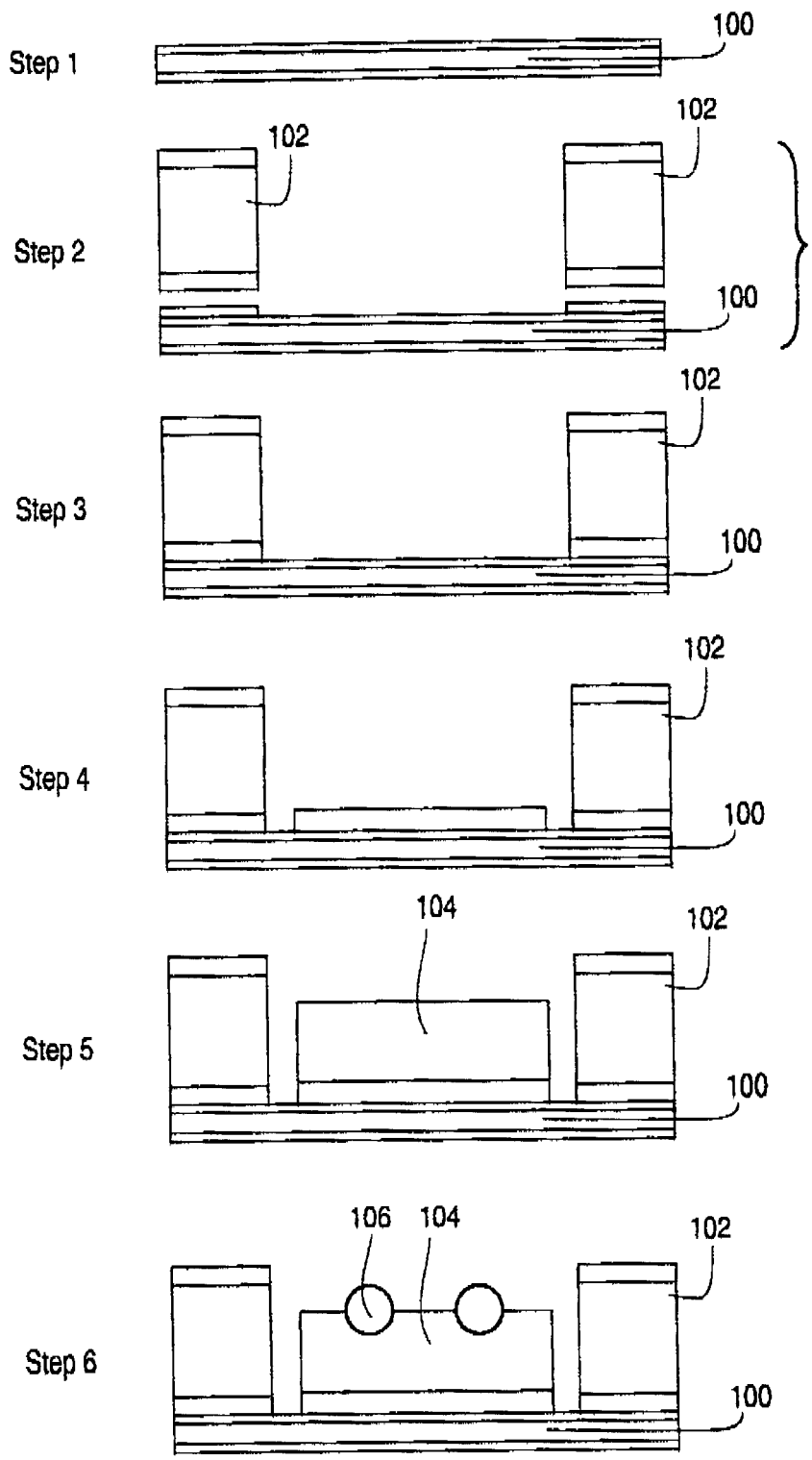

Step 1

Step 2

Step 3

Step 4

Step 5

Step 6

Step 1

Step 2

Step 3

Step 4

Step 5

Step 6

Step 7

Step 1

Step 2

Step 3

Step 4

Step 5

Step 6

Step 7

Step 1

Step 2

Step 3

Step 4

Step 5

Step 6

Step 7

MULTIPLE LEADFRAME LAMINATED IC PACKAGE

FIELD OF THE INVENTION

This invention relates in general to integrated circuit packaging, and more particularly to a method for manufacture of an integrated circuit package.

BACKGROUND OF THE INVENTION

High performance integrated circuit (IC) packages are well known in the art improvements in IC packages are driven by demands for increased thermal and electrical performance, decreased size and cost of manufacture.

Typically, array packaging such as ball grid array (BGA) packages provide for a high density package. FIG. 1 shows a typical prior art package in which a copper leadframe 20 is etched to approximately half the leadframe thickness to form a pocket for the semiconductor die 22. The etch-down process results in an etch-down pocket with a radius 24 at each pocket corner (where the base 26 on which the semiconductor die 22 is mounted, meets each side 28). Each IC package includes a pocket that is large enough to accommodate the die 22 and the radius 24. Thus, the radius 24 limits the reduction in the size of the pocket.

Prior art IC packages such as that shown in FIG. 1 are manufactured such that each of the contacts lie in a single plane. Thus, the solder ball contacts 30 on the leadframe lie in the same plane as the solder ball contacts 30 on the semiconductor die. The half etch depth of the leadframe 20 is important in order to ensure that all of the solder ball contacts 30 lie in a single plane. The half etch depth Is difficult to accurately control and therefore manufacture of the IC package with solder ball contacts 30 in a single plane is difficult.

Accordingly, it is an object of an aspect of the present invention to provide a method for manufacturing an IC package that obviates or mitigates at least some of the disadvantages of the prior art.

SUMMARY OF THE INVENTION

In one aspect of the present invention there is provided a method of fabricating an integrated circuit package. The method includes providing a first leadframe and a second leadframe laminating the second leadframe to a portion of the first leadframe in order to create a multi-layer laminated leadframe, and mounting a semiconductor die on another portion of the first leadframe.

In another aspect of the present invention there is provided an integrated circuit package. The integrated circuit package includes afirst leadframe, a second leadframe laminated to a portion of the first leadframe in order to create a multi-layer laminated leadframe, and a semiconductor die mounted to another portion of the first leadframe.

In a particular aspect, the IC package of the present invention is manufactured without a large radius in the etch-down pocket of the leadframe strip. Advantageously, this permits reduced overall package size. Also, accurate control over manufacturing processes allows for planarity of the contacts.

In another aspect, the use of the solder contact balls is obviated by the use of solder plating on the leadframe strip. Also, die level solder Lumps are replaced with copper plates. Advantageously, this package provides reduced electrical resistance to the electrical contacts, simpler and more cost effective construction.

BRIEF DESCRIPTION OF THE DRAWING

The present invention will be better understood with reference to the following drawings wherein like numerals refer to like parts throughout, and in which:

FIGS. 4A to 4F show the processing steps for manufacturing an alternative IC package in accordance with another embodiment of the present invention;

FIGS. 5A to 5F show the processing steps for manufacturing the IC package of

DETAILED DESCRIPTION OF THE PREFERRED EMBODIMENTS

Figure 1:
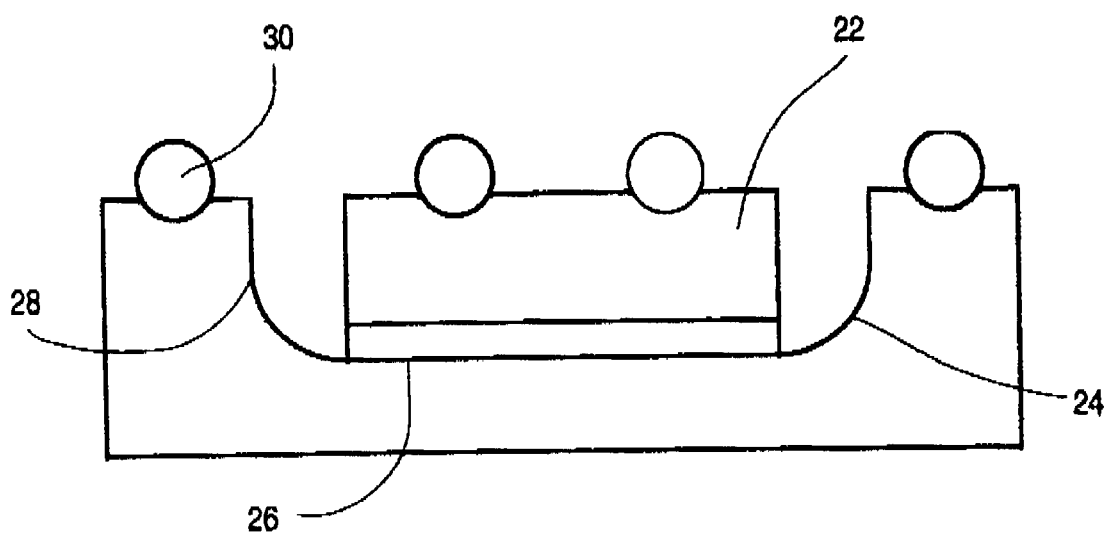
FIG. 1 is a cross section of a typical prior art semiconductor die package.
Figure 2A:
FIGS. 2A to 2F show the processing steps for manufacturing an IC package in accordance with an embodiment of the present invention.
Figure 2B:
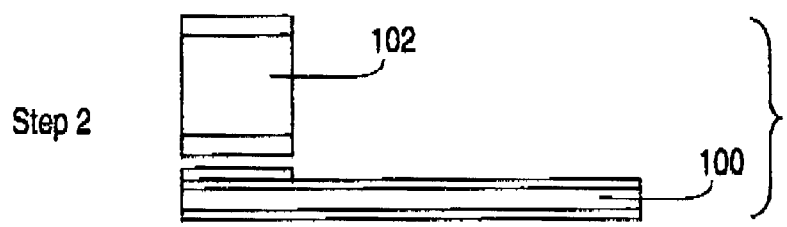

Reference is first made to FIGS. 2A to 2F to describe the processing steps for manufacturing an IC package in accordance with an embodiment of the present invention. FIG. 2A shows a cross-sectional side view of a copper (Cu) panel substrate which forms the raw material of the leadframe strip indicated generally by the numeral 100. As discussed in greater detail in Applicants' U.S. Pat. No. 6,229,200, the leadframe strip is divided into a plurality of sections, each of which incorporates a plurality of leadframe units in an array (e.g. 3×3 array, 5×5 array, etc.). Only one such unit is depicted in the cross-sectional view of FIG. 2A.

As shown in FIG. 2A, the copper strip is coated with a silver (Ag) plating on a bottom surface thereof and a solder plating on a top surface thereof. In one embodiment, the plating is a eutectic solder composition. This coating is added to enhance lamination and provide and surface for soldering.

Figure 2C:
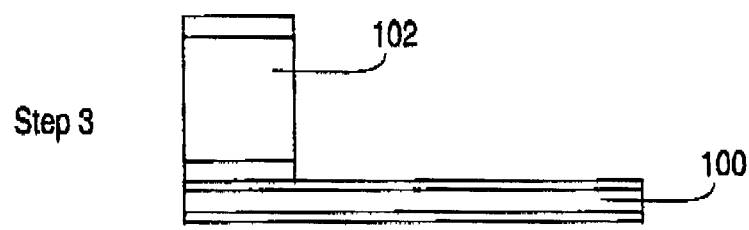
Figure 2D:
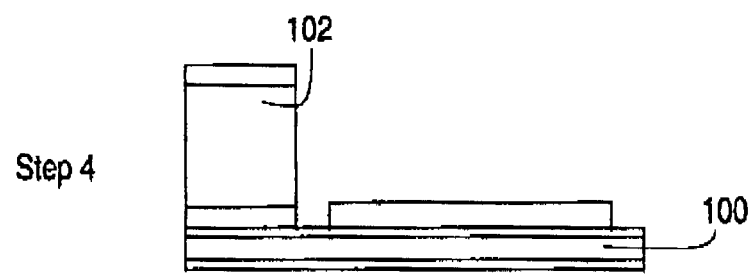

Solder flux is added to a portion of the leadframe 100 (FIG. 28) and a second leadframe 102 with solder plating on both a top and a bottom surface thereof is laminated onto the first leadframe 100 using a proximity placement and thermal solder reflow technique to form a single pocket-type leadframe (FIG. 2C). In an alternative embodiment the second leadframe is laminated onto the first leadframe using a hot roller thermo-compressive cladding process.

Figure 2E:
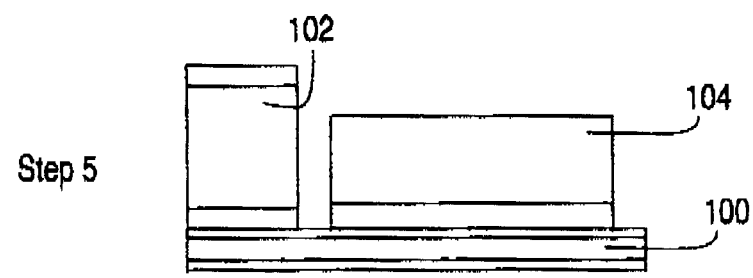

Next, the semiconductor die is mounted to the leadframe using known techniques. In the present embodiment, solder paste is dispensed on another portion of the first leadframe 100 in FIG. 2D and the semiconductor die is attached to the first leadframe 100 by solder reflow technique (FIG. 2E). The semiconductor die is coated with a suitable surface for soldering, such as titanium (Ti), tungsten (W), or gold (Au)

for mounting via solder reflow. In an alternative embodiment, the die is attached using a silver-filled epoxy, as will be understood by those of skill in the art.

Figure 2F:
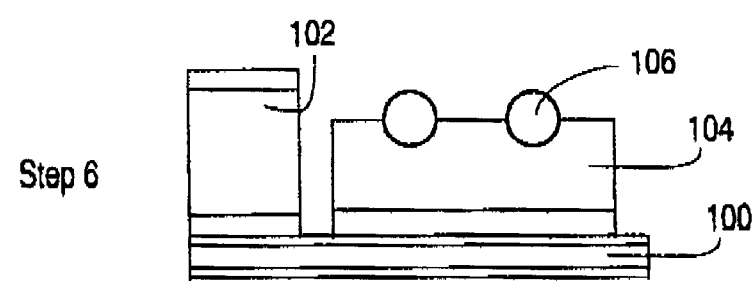

Next, solder ball contacts 106 are mounted on a vapor deposited layer referred to as "under bump metallurgy" or UBM on the semiconductor die 104 as will be understood by those of skill in the art (FIG. 2F).

Figure 3A:
FIGS. 3A to 3F snow the processing steps for manufacturing the IC package of FIG. 1F in accordance with an alternative embodiment of the present invention.

FIGS. 3A to 3F show the processing steps for manufacturing the IC package of FIG. 2F in accordance with an alternative embodiment of the present invention. The order of the process steps in the present embodiment is different from the order of the steps of the embodiment of FIGS. 2A to 2F. FIG. 3A shows a cross-sectional side view of the copper (Cu) panel substrate which forms the raw material of the leadframe strip indicated generally by the numeral 100. Similar to the embodiment of FIG. 2A, the copper strip is coated with a silver (Ag) plating on a bottom surface thereof and a solder plating on a top surface thereof.

Figure 3B:
Figure 3C:
Figure 3D:
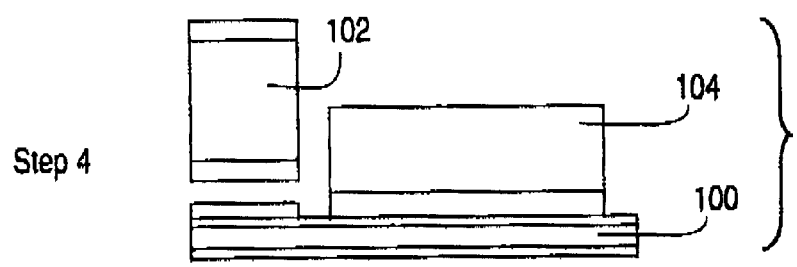

Solder paste is dispensed on a portion of the leadframe 100 in FIG. 3B and the semiconductor die 104 is attached to the leadframe 100 by solder reflow technique (FIG. 3C). The semiconductor die 104 is coated with a suitable surface for soldering, such as titanium (Ti), tungsten (W), or gold (Au) for mounting via solder reflow. This is a solderable vapor deposit structure made in layers of three.

Figure 3E:
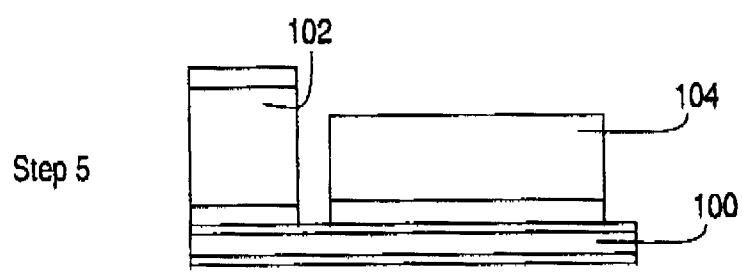

Next, solder flux is added to another portion of the first leadframe (FIG. 3D) and a second leadframe 102 with solder plating on both a top and a bottom surface thereof is laminated onto the first leadframe 100 using a solder reflow technique to form a single pocket-type leadframe (FIG. 3E).

Figure 3F:
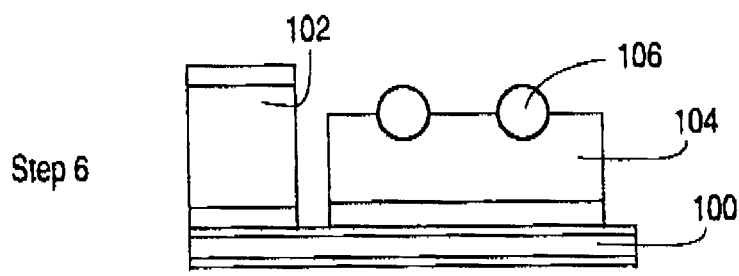
Figure 5A:
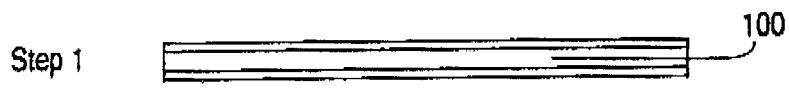
Figure 5B:
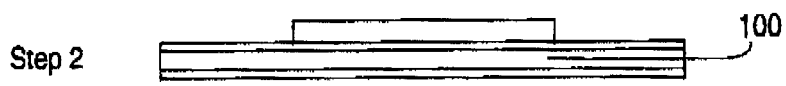
Figure 5C:
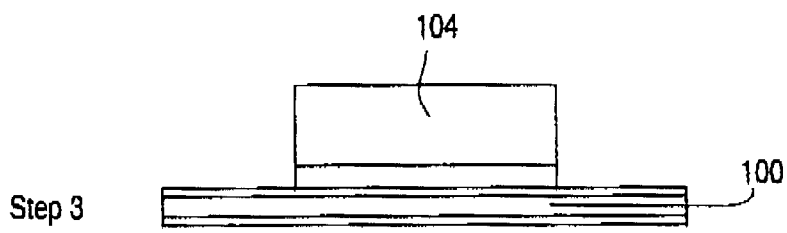
Figure 5D:
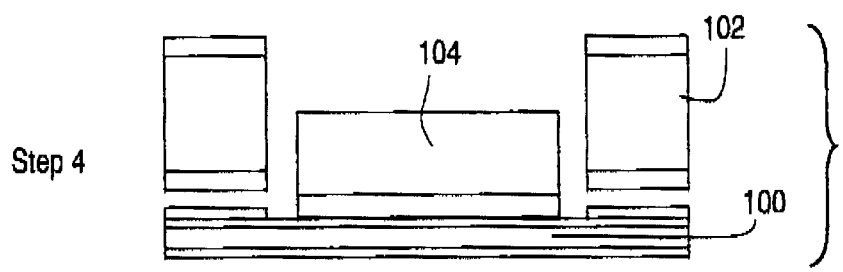
Figure 5E:
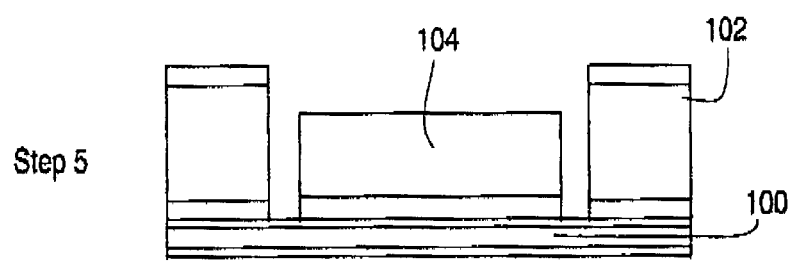
Figure 5F:
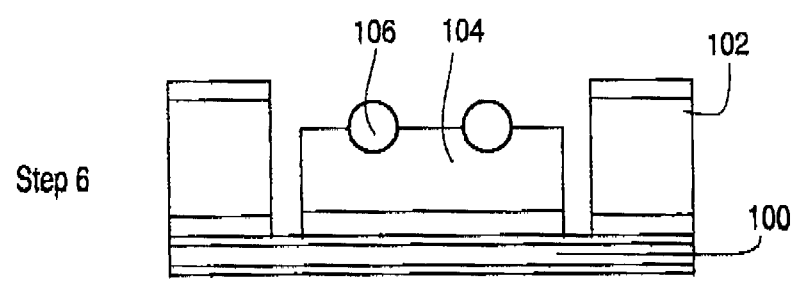

The solder ball contacts 106 are then mounted on the semiconductor die 104 as shown in FIG. 3F.

FIGS. 4A to 4F show the processing steps for manufacturing an alternative IC package in accordance with another embodiment of the present invention. The steps of FIGS. 4A to 4F are similar to the steps of FIGS. 2A to 2F except that the second leadframe 102 of the embodiment of FIGS. 4A to 4F is a different shape than the second leadframe 102 of the embodiment of FIGS. 2A to 2F. As shown in FIGS. 4B to 4F, the second leadframe 102 provides a pocket in the center of each unit in which the semiconductor die 104 is mounted, when laminated on the first leadframe 100.

FIGS. 5A to 5F show the processing steps for manufacturing the IC package of FIG. 4F in accordance with an alternative embodiment of the present invention. The steps of FIGS. 5A to 5F are similar to the steps of FIGS. 3A to 3F except that the second leadframe 102 of the embodiment of FIGS. 3A to 3F is a different shape that the second leadframe 102 of the embodiment of FIGS. 3A to 3F. Again, the second leadframe 102 provides a pocket in the center of each unit in which the semiconductor die 104 is mounted when laminated on the first leadframe 100.

Figure 6A:
FIGS. 6A to 6G show the processing steps for manufacturing an IC package in accordance with another embodiment of the present invention.
Figure 6B:

FIGS. 6A to 6G show the processing steps for manufacturing an IC package in accordance with another embodiment of the present invention. FIG. 6A shows a cross-sectional side view of a copper (Cu) panel substrate which forms the raw material of the leadframe strip indicated generally by the numeral 100. The copper strip is coated with a silver (Ag) plating on a bottom surface thereof and a solder plating on a top surface thereof, as shown.

Figure 6C:
Figure 6D:

Next a solder flux is added to a portion of the first leadframe 100 (FIG. 6B) and a second leadframe 102 with solder plating on both a top and a bottom surface thereof is laminated onto the first leadframe 100 using a solder reflow technique to form a single pocket-type leadframe (FIG. 6C).

Figure 6E:
Figure 6F:
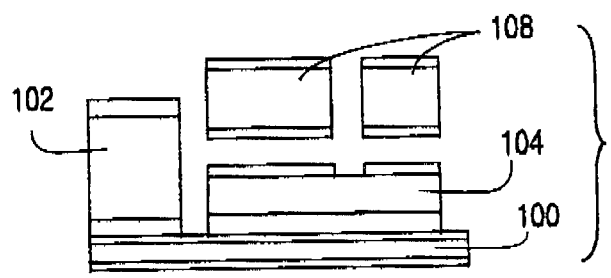

Solder paste is then dispensed on a portion of the first leadframe 100 (FIG. 6D) and the semiconductor die is attached to the first leadframe 100 by solder reflow technique (FIG. 6E). The semiconductor die is coated with a suitable surface for soldering, such as titanium (Ti), tungsten (W), or gold (Au) for mounting via solder reflow.

Next, portions of the semiconductor die are coated with solder flux (FIG. 6F) and a third leadframe 108 with solder plating on both top and a bottom surfaces thereof is laminated to coated contact pads or I/O pads on the surface of the semiconductor die (FIG. 6G) via solder reflow technique. In an alternative embodiment the third leadframe 108 is laminated to the coated contact pads of the semiconductor die by epoxy. The contact pads are coated with, for example, Ti, W, or Au, for compatibility with the solder or with epoxy.

Figure 6G:
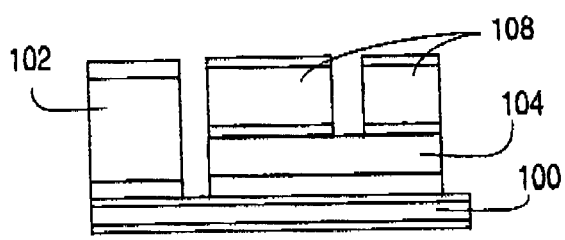
Figure 7A:
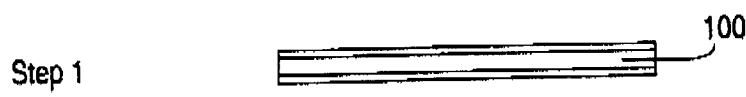
FIGS. 7A to 7G snow the processing steps for manufacturing the IC package of FIG. 5F in accordance with an alternative embodiment of the present invention.
Figure 7B:
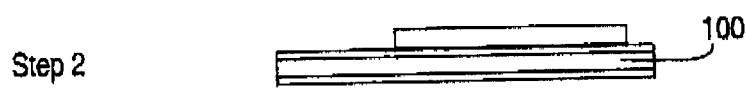

FIGS. 7A to 7G show the processing steps for manufacturing the IC package of FIG. 6G in accordance with an alternative embodiment of the present invention. The order of the process steps in the present embodiment is different from the order of the steps of the embodiment of FIGS. 6A to 5G. FIG. 7A shows a cross-sectional side view of the copper (Cu) panel substrate, which forms the raw material of the lead frame strip, indicated generally by the numeral 100. Similar to the embodiment of FIG. 6A, the copper strip is coated with a silver (Ag) plating on a bottom surface thereof and a solder plating on a top surface thereof.

Figure 7C:
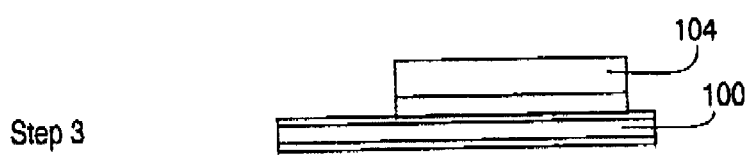
Figure 7D:
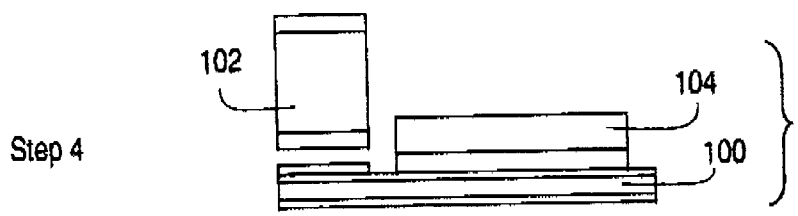

Solder paste is dispensed on a portion of the leadframe 100 (FIG. 7B) and the semiconductor die 104 is attached to the leadframe 100 by solder reflow technique (FIG. 7C). The semiconductor die 104 is coated with a suitable surface for soldering, Such as titanium (Ti), tungsten (W), or gold (Au) for mounting via solder reflow.

Figure 7E:
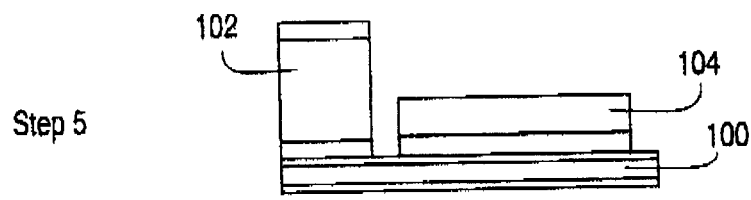
Figure 7F:
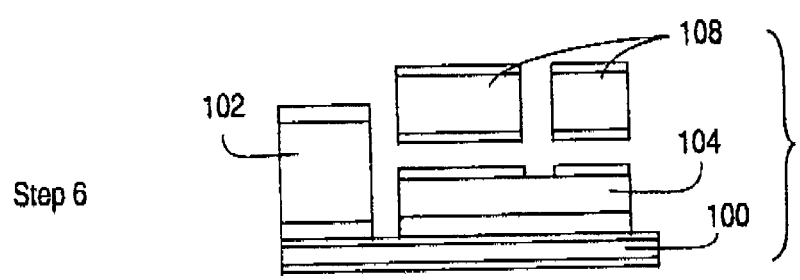
Figure 7G:
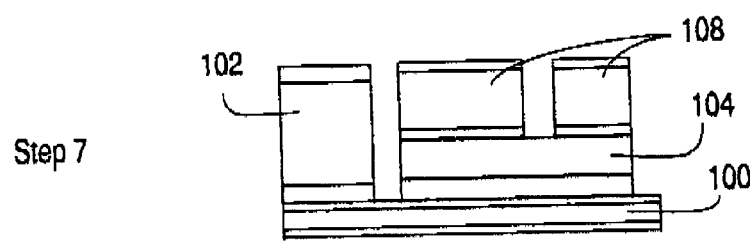

Next, solder flux is dispensed on another portion of the leadframe 100 (FIG. 7D) and a second leadframe 102 having solder plating on both a top and a bottom surface thereof is laminated onto the first leadframe 100 using a solder reflow technique to form a single pocket-type leadframe (FIG. 7E).

Solder flux is then dispensed onto portions of the semiconductor die 104 (FIG. 7F) and a third leadframe 108 with solder plating on both top and bottom surfaces is laminated on the surface of the semiconductor die.

Figure 8A:
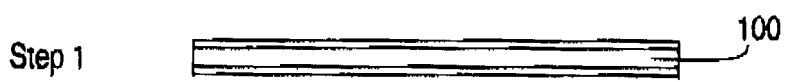
FIGS. 8A to 8G snow the processing steps for manufacturing an IC package in accordance with yet another embodiment of the present invention.
Figure 8B:
Figure 8C:
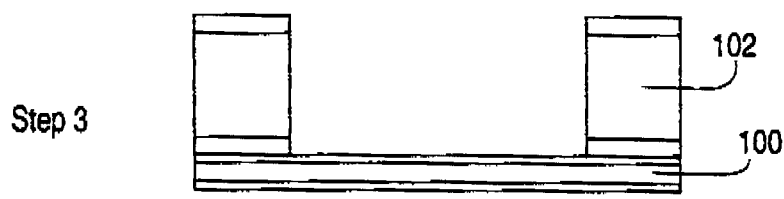
Figure 8D:
Figure 8E:
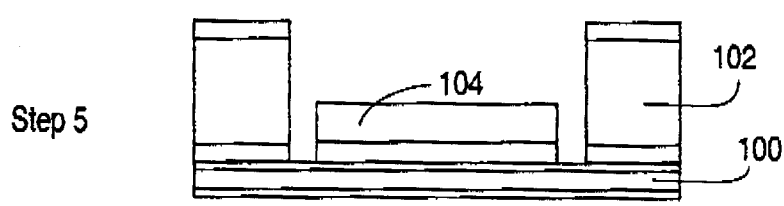
Figure 8F:
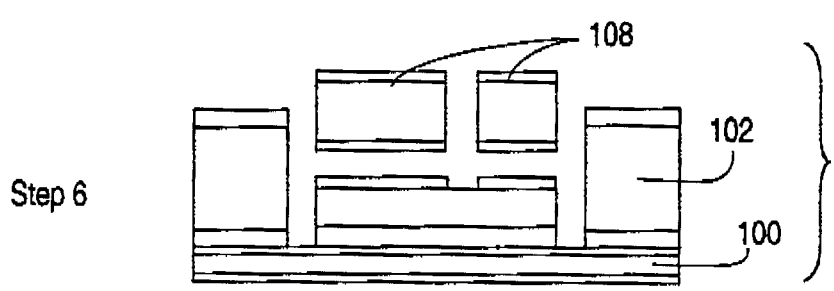

FIGS. 8A to 8G show the processing steps for manufacturing an alternative IC package in accordance with another embodiment of the present invention. The steps of FIGS. 8A to 8G are similar to the steps of FIGS. 6A to 6G except that the second leadframe 102 of the embodiment of FIGS. 8A to 5G is a different shape than the second leadframe 102 of the embodiment of FIGS. 6A to 6G As shown in FIGS. 8B to 8G, the second leadframe 102 provides a pocket in the center of each unit in which the semiconductor die 104 is mounted, when laminated on the first leadframe 100.

Figure 8G:
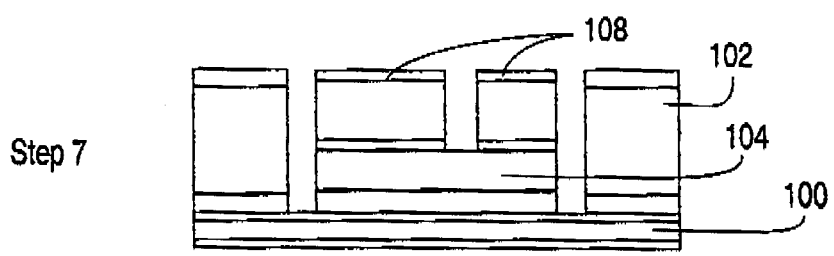
Figure 9A:
FIGS. 9A to 9G show the processing steps for manufacturing the IC package of FIG. 6F in accordance with an alternative embodiment of the present invention.
Figure 9B:
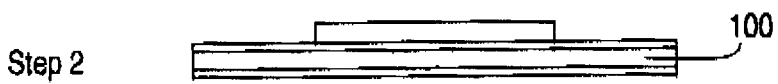
Figure 9C:
Figure 9D:
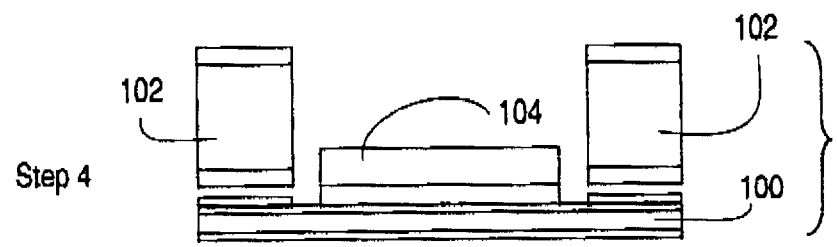
Figure 9E:
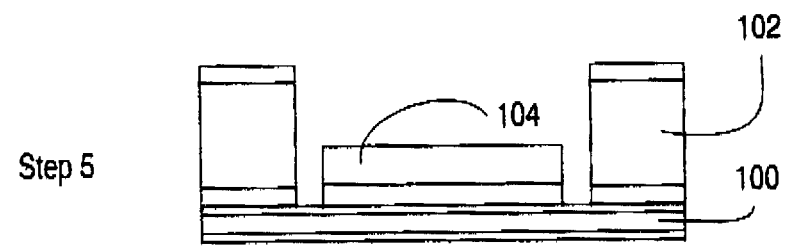
Figure 9F:
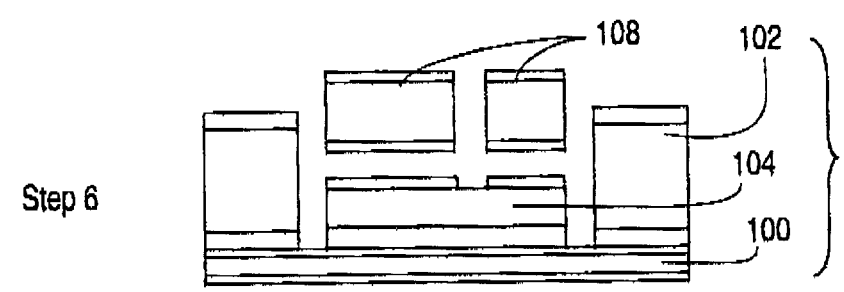
Figure 9G:
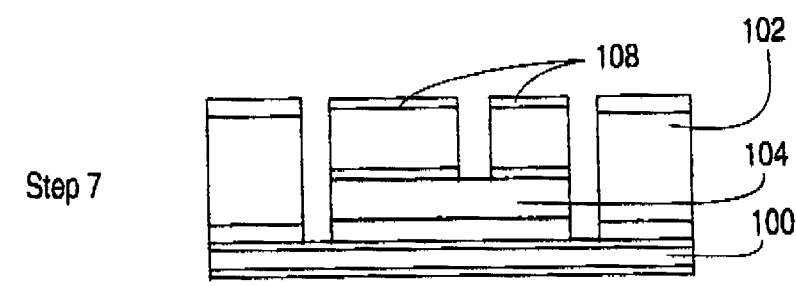

FIGS. 9A to 9G show the processing steps for manufacturing the IC package of FIG. 8G in accordance with an alternative embodiment of the present invention. The steps of FIGS. 9A to 9G are similar to the steps of FIGS. 7A to 7G except that the second leadframe 102 of the embodiment of FIGS. 9A to 9G is a different shape that the second leadframe 102 of the embodiment of FIGS. 7A to 7G. Again, the second leadframe 102 provides a pocket in the center of each unit in which the semiconductor die 104 is mounted when laminated on the first leadframe 100.

Alternative embodiments and variations are possible. For example, in an alternative embodiment the semiconductor die is attached to the leadframe by reflow of the solder plated on the copper of the first leadframe 100 rather than by the addition of solder paste to the leadframe and subsequent reflow. In yet another alternative embodiment, the semiconductor die is mounted on the leadframe via silver epoxy.

Other embodiments and variations will occur to those of skill in the art. All such embodiments and variations are believed to be within the scope and sphere of the present invention as defined by the claims appended hereto.

What is claimed is:

1. A method of fabricating an integrated circuit package comprising:

providing a first leadframe and a second leadframe;

laminating said second leadframe to a portion of said first leadframe in order to create a multi-layer laminated leadframe; and mounting a semiconductor die on another portion of said first leadframe.

2. The method of fabricating an integrated circuit package according to claim 1, further comprising mounting a plurality of contact balls on said semiconductor die.

3. The method of fabricating an integrated circuit package according to claim 1, further comprising:

providing a third leadframe; and laminating said third leadframe on at least a portion of said semiconductor die.

4. The method of fabricating an integrated circuit package according to claim 1, wherein said first leadframe comprises a copper strip having silver plating on a first surface and solder plating on an opposing second surface thereof.

5. The method of fabricating an integrated circuit package according to claim 1, wherein said second leadframe comprises a copper strip having solder plating on first and second surfaces thereof.

6. The method of fabricating an integrated circuit package according to claim 3, wherein said third leadframe comprises a copper strip having solder plating on first and second surfaces thereof.

7. The method of fabricating an integrated circuit package according to claim 1, wherein said second leadframe is laminated to said first leadframe via solder reflow technique.

8. The method of fabricating an integrated circuit package according to claim 3, wherein said third leadframe is laminated to said semiconductor die via solder reflow technique.

9. The method of fabricating an integrated circuit package according to claim 1 wherein said semiconductor die is coated with at least one of titanium, tungsten, gold, or a combination thereof for soldering.

* * * * *